(12) United States Patent
Hirayama et al.

(10) Patent No.: US 12,119,212 B2
(45) Date of Patent: Oct. 15, 2024

(54) WAFER SUPPORT DEVICE

(71) Applicant: SUMITOMO OSAKA CEMENT CO., LTD., Tokyo (JP)

(72) Inventors: Masaki Hirayama, Tokyo (JP); Tetsuro Itagaki, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 181 days.

(21) Appl. No.: 17/999,833

(22) PCT Filed: May 27, 2021

(86) PCT No.: PCT/JP2021/020201
§ 371 (c)(1),
(2) Date: Nov. 23, 2022

(87) PCT Pub. No.: WO2022/004210
PCT Pub. Date: Jan. 6, 2022

(65) Prior Publication Data
US 2023/0223244 A1  Jul. 13, 2023

(30) Foreign Application Priority Data
Jun. 29, 2020 (JP) ................................. 2020-111803

(51) Int. Cl.
*H01J 37/32* (2006.01)
*H01L 21/683* (2006.01)

(52) U.S. Cl.
CPC .. *H01J 37/32724* (2013.01); *H01J 37/32082* (2013.01); *H01J 37/32568* (2013.01);
(Continued)

(58) Field of Classification Search
CPC ........... H01J 37/32715; H01J 37/32091; H01J 37/32577; H01J 37/32568;
(Continued)

(56) References Cited

U.S. PATENT DOCUMENTS

| 2010/0096084 | A1* | 4/2010 | Lee ................... H01L 21/67069 |
| | | | 156/345.43 |
| 2011/0096461 | A1* | 4/2011 | Yoshikawa ......... H01L 21/6833 |
| | | | 361/234 |

(Continued)

FOREIGN PATENT DOCUMENTS

| JP | 2005197391 A | * | 7/2005 |
| JP | 2010-524225 A | | 7/2010 |

(Continued)

OTHER PUBLICATIONS

Machine translation of Abe et al. Japanese Patent Document JP 2005-197391 A Jul. 2005 (Year: 2005).*

(Continued)

*Primary Examiner* — Kevin J Comber
(74) *Attorney, Agent, or Firm* — Merchant & Gould P.C.

(57) ABSTRACT

A wafer support device includes a dielectric substrate and an RF electrode provided in the dielectric substrate. The RF electrode is divided into a plurality of zone electrodes arranged in a planar direction of the dielectric substrate. The wafer support device has: a short-circuit member interconnecting the plurality of zone electrodes; and a main power supply rod connected to the short-circuit member from a back side of the dielectric substrate.

13 Claims, 3 Drawing Sheets

(52) U.S. Cl.
CPC .... *H01J 37/32577* (2013.01); *H01L 21/6833* (2013.01); *H01J 37/32541* (2013.01); *H01J 2237/2007* (2013.01)

(58) Field of Classification Search
CPC .......... H01J 37/32721; H01J 37/32532; H01J 37/32082; H01J 37/32541; H01J 2237/2007; H01L 21/683; H01L 21/6833; H01L 21/67109; H01L 21/67103; H01L 21/6831
USPC ....................................................... 361/234
See application file for complete search history.

(56) References Cited

U.S. PATENT DOCUMENTS

| | | | | |
|---|---|---|---|---|
| 2019/0355556 | A1* | 11/2019 | Takahashi | ......... H01J 37/32724 |
| 2020/0161106 | A1* | 5/2020 | Takahashi | ............... B32B 18/00 |

FOREIGN PATENT DOCUMENTS

| | | | |
|---|---|---|---|
| JP | 2011-119654 A | | 6/2011 |
| JP | 2015109139 A | * | 6/2015 |
| WO | 2008/120946 A1 | | 10/2008 |
| WO | 2018/163935 A1 | | 9/2018 |
| WO | 2020/008859 A1 | | 1/2020 |

OTHER PUBLICATIONS

Machine translation of Abe et al. Japanese Patent Document JP 2015-109139 A Jun. 2015 (Year: 2015).*
International Search Report for PCT/JP2021/020201 (Jul. 13, 2021).

* cited by examiner

WAFER SUPPORT DEVICE

TECHNICAL FIELD

This application is a National Stage Application of PCT/JP2021/020201, filed on May 27, 2021, which claims benefit of priority to Japanese Patent Application No. 2020-111803, filed in Japan on Jun. 29, 2020, the content of which is incorporated herein by reference. To the extent appropriate, a claim of priority is made to each of the above disclosed applications.

BACKGROUND ART

A configuration in which an RF electrode for plasma generation and a heater electrode are built in a ceramic substrate is known as a wafer support stand used in semiconductor manufacturing equipment (see, for example, Patent Literature 1).

CITATION LIST

Patent Literature

Patent Literature No. 1: International Publication No. 2018/163935

SUMMARY OF INVENTION

Technical Problem

Wafer support devices are required to respond to high temperatures as wafer processing temperatures rise in semiconductor manufacturing equipment. For example, a wafer support device used for wafer processing at a high temperature of 400 degrees Celsius or more is required to be reliable enough to withstand thermal stress attributable to an inter-portion difference in thermal expansion coefficient. In addition, as electric power input to RF electrodes increases, damage attributable to local heat generation of the RF electrodes has also become problematic.

An object of the present invention is to provide a wafer support device highly reliable when used at a high temperature.

Solution to Problem

Provided according to a first aspect of the present invention is a wafer support device including a dielectric substrate and an RF electrode provided in the dielectric substrate. The RF electrode is divided into a plurality of zone electrodes arranged in a planar direction of the dielectric substrate. The wafer support device has a short-circuit member which interconnects the plurality of zone electrodes, and a main power supply rod which is connected to the short-circuit member from a back side of the dielectric substrate.

The wafer support device of the first aspect of the present invention preferably includes the following features. It is also preferable to combine two or more of the following features as necessary.

The RF electrode may be divided into a plurality of the zone electrodes which are arranged in a radial direction with respect to a center position of the dielectric substrate in plan view.

The RF electrode may be divided into a plurality of the zone electrodes which are arranged in a circumferential direction with respect to a center position of the dielectric substrate in plan view.

The RF electrode may be divided into a plurality of the zone electrodes which are equal in area.

The short-circuit member may have a plurality of power supply pins which respectively extend from the plurality of zone electrodes to the back side of the dielectric substrate and exposed to a back surface of the dielectric substrate, and a short-circuit electrode which is positioned on the back surface of the dielectric substrate, interconnects the plurality of power supply pins with each other, and connected to the main power supply rod.

The short-circuit electrode may be fixed to the plurality of power supply pins in a bent state.

A heater electrode and an electrostatic adsorption electrode may be provided in the dielectric substrate, the heater electrode may be positioned closer to the back side of the dielectric substrate than the RF electrode, and the electrostatic adsorption electrode may be positioned closer to a wafer placement surface side of the dielectric substrate than the RF electrode.

Advantageous Effects of Invention

According to one aspect of the present invention, there is provided a wafer support device highly reliable when used at a high temperature.

DESCRIPTION OF EMBODIMENTS

Figure 1:
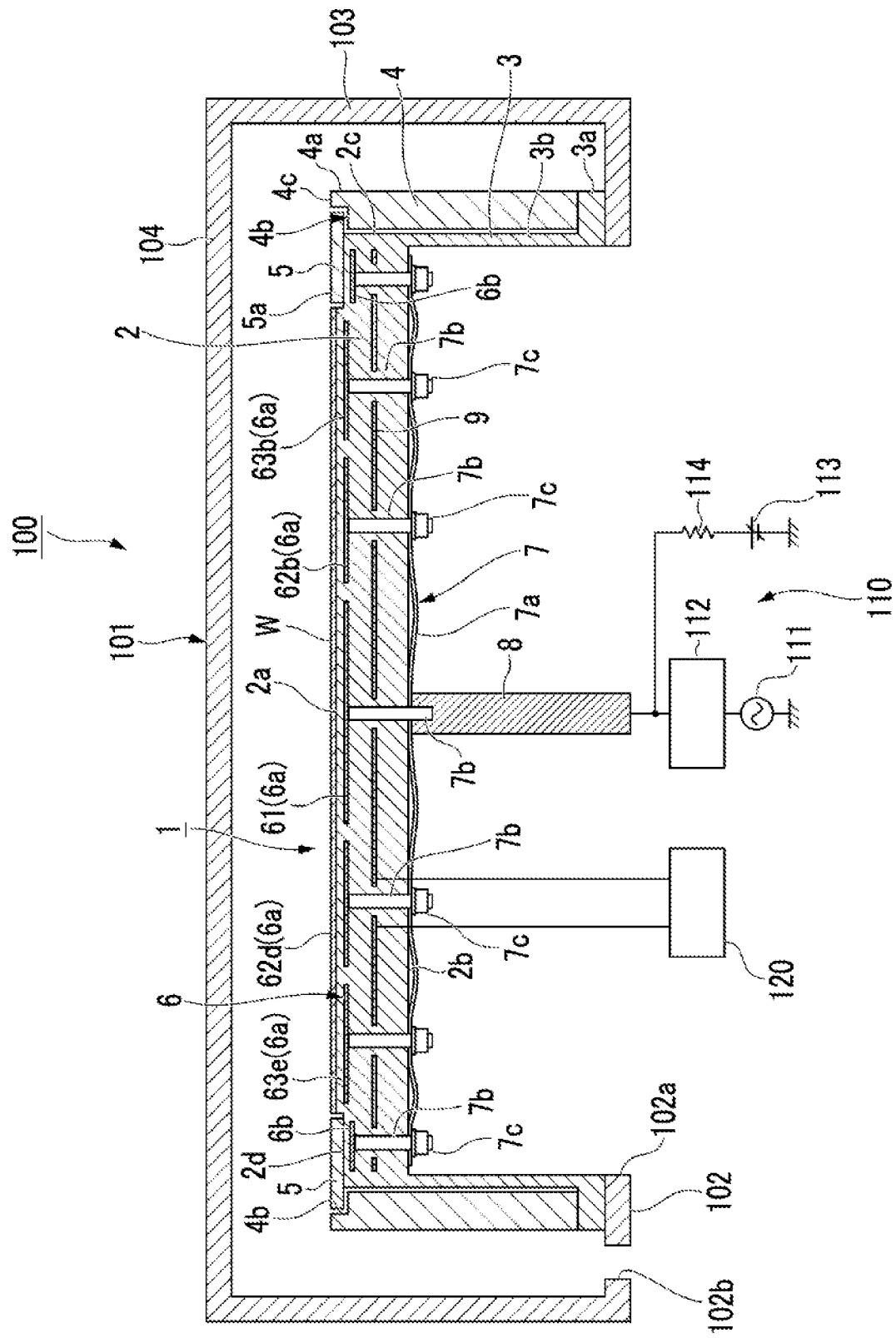
FIG. 1 is a schematic cross-sectional view illustrating a preferred example of a plasma treatment apparatus provided with an electrostatic chuck device of an embodiment.

A preferred example of an electrostatic chuck device as a preferred embodiment of the wafer support device of the present invention will be described below with reference to FIGS. 1 and 2. It should be noted that in each of the drawings, the dimensions, proportions, and the like of components may be changed as appropriate so that the drawing is easy to see. Numbers, positions, sizes, members, and so on can be, for example, omitted, added, changed, replaced, and exchanged without departing from the spirit of the present invention.

FIG. 1 is a schematic cross-sectional view of a plasma treatment apparatus provided with the electrostatic chuck device (wafer support device) of the present embodiment. A plasma treatment apparatus 100 includes a vacuum vessel 101 and an electrostatic chuck device 1 fixed in the vacuum vessel 101. The vacuum vessel 101 has a bottom wall 102, a tubular side wall 103 extending upward from the outer peripheral end of the bottom wall 102, and a top wall 104 fixed to the upper end of the side wall 103 and facing the bottom wall 102 in the up-down direction.

The electrostatic chuck device 1 is fixed to the bottom portion of the internal space of the vacuum vessel 101. The electrostatic chuck device 1 is fixed to the inside surface of the bottom wall 102 (upper surface in the drawing). The electrostatic chuck device 1 of the present embodiment is disposed in the vacuum vessel 101 with a placement surface (wafer support surface) 2a where a wafer W is placed facing upward. The form of disposition of the electrostatic chuck device 1 is an example, and the electrostatic chuck device 1 may be disposed in another form.

The bottom wall 102 of the vacuum vessel 101 has an opening portion 102a penetrating the bottom wall 102 in the thickness direction and an exhaust port 102b. The electrostatic chuck device 1 blocks the opening portion 102a from the inside of the vacuum vessel 101 (upper side in the drawing). The exhaust port 102b is positioned beside the electrostatic chuck device 1. A vacuum pump (not illustrated) is connected to the exhaust port 102b.

The electrostatic chuck device 1 has a dielectric substrate 2 having the placement surface 2a where the wafer W is placed, a support member 3 supporting the dielectric substrate 2, a side cover 4 positioned on the outer peripheral side of the support member 3, and a focus ring 5 disposed on the upper surface of the dielectric substrate 2 in the drawing.

The dielectric substrate 2 is circular in plan view. The dielectric substrate 2 is made of a composite sintered body having mechanical strength and durability against a corrosive gas and the plasma thereof. Ceramics having mechanical strength and durability against a corrosive gas and the plasma thereof is preferably used as the dielectric material configuring the dielectric substrate 2. An aluminum oxide ($Al_2O_3$) sintered body, an aluminum nitride (AlN) sintered body, an aluminum oxide ($Al_2O_3$)-silicon carbide (SiC) composite sintered body, and so on are preferably used as the ceramics configuring the dielectric substrate 2.

It is preferable that a plurality of protrusion portions (not illustrated) are formed at predetermined intervals on the placement surface 2a of the dielectric substrate 2. Each of the plurality of protrusion portions has a diameter smaller than the thickness of the wafer W. The plurality of protrusion portions of the placement surface 2a support the wafer W. Any shape can be selected as the shape of the protrusion portion, and examples thereof include a columnar shape.

The support member 3 is a cylindrical member extending from the outer peripheral end of a back surface 2b of the dielectric substrate 2 toward the bottom wall 102. The back surface 2b is a surface facing the side opposite to the placement surface 2a of the dielectric substrate 2 (lower side in the drawing). In the case of the present embodiment, the dielectric substrate 2 and the support member 3 configure a single component. The dielectric substrate 2 and the support member 3 may be separate components.

The support member 3 has a flange 3a extending radially outward from the end portion on the bottom wall 102 side (lower side in the drawing). The flange 3a has a circular ring shape in plan view. The support member 3 is fixed to the bottom wall 102 by, for example, screwing the flange 3a and the bottom wall 102 together. The flange 3a is disposed along the peripheral edge of the opening portion 102a of the bottom wall 102. The space between the flange 3a and the bottom wall 102 is hermetically sealed by, for example, an O-ring.

The space inside the support member 3 is connected to the space outside the vacuum vessel 101 via the opening portion 102a of the bottom wall 102. The back surface 2b of the dielectric substrate 2 is exposed to the space inside the support member 3. A worker can access the back surface 2b of the dielectric substrate 2 through the opening portion 102a of the bottom wall 102.

The side cover 4 is a cylindrical member extending in the up-down direction. The side cover 4 covers the outside of the support member 3. In the case of the present embodiment, the side cover 4 faces a side end surface 2c of the dielectric substrate 2 and an outer peripheral surface 3b of the support member 3 in the radial direction. The side cover 4 protects the side end surface 2c of the dielectric substrate 2 and the outer peripheral surface 3b of the support member 3 from plasma. The side cover 4 is made of, for example, aluminum oxide ($Al_2O_3$), quartz, or the like. The material of the side cover 4 is not particularly limited insofar as the material has required plasma resistance. The electrostatic chuck device 1 can also be configured without the side cover 4.

In the present embodiment, the side cover 4 is installed on the upper surface of the flange 3a. The side cover 4 may be fixed to the inner wall of the vacuum vessel 101. An upper end portion 4a of the side cover 4 is positioned beside the dielectric substrate 2. The side cover 4 has the notch portion 4b extending along the inner peripheral edge in the corner portion on the inner peripheral side of the upper end portion 4a. The outer peripheral portion of the focus ring 5 is disposed inside the notch portion 4b. The height position of an upper end surface 4c of the side cover 4 (position in the up-down direction in the drawing) substantially matches the height position of an upper surface 5a of the focus ring 5 and the height position of the upper surface of the wafer W.

The electrostatic chuck device 1 has an RF electrode 6 provided in the dielectric substrate 2, a short-circuit member 7 connected to the RF electrode 6, and a main power supply rod 8 connected to the short-circuit member 7. It should be noted that RF is an abbreviation for "Radio Frequency".

In the case of the present embodiment, the RF electrode 6 serves both as an electrode generating plasma on the wafer W and an electrode for electrostatic adsorption fixing the wafer W by an electrostatic adsorption force. The RF electrode 6 includes a zone electrode performing plasma generation and electrostatic wafer adsorption.

As illustrated in FIG. 1, the RF electrode 6 is positioned on the surface layer portion on the placement surface 2a side in the thickness direction of the dielectric substrate 2.

Figure 2:
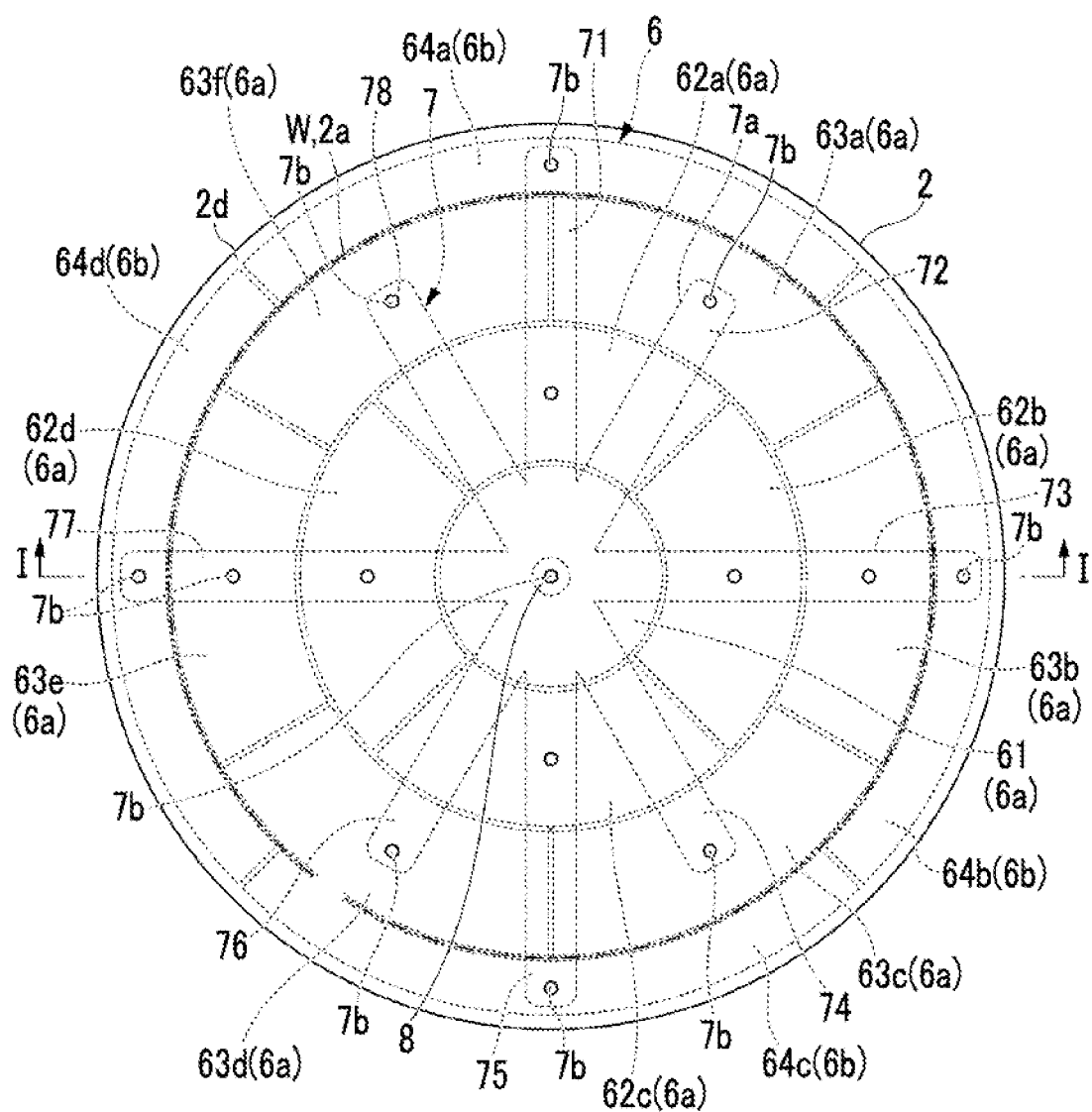
FIG. 2 is a schematic plan view illustrating a preferred example of an RF electrode and a short-circuit member of the embodiment.

As illustrated in FIG. 2, the RF electrode 6 is divided into a plurality of electrodes arranged in the plate surface direction of the dielectric substrate 2 (horizontal direction). The RF electrode 6 has a first zone electrode 6a positioned on the placement surface 2a and a second zone electrode 6b positioned in a ring adsorption region 2d around the placement surface 2a. In the case of the present embodiment, the first zone electrode 6a is made of 11 zone electrodes arranged in the planar direction of the dielectric substrate 2. The second zone electrode 6b is made of four zone electrodes arranged in the planar direction of the dielectric substrate 2.

The first zone electrode 6a is positioned in the region of the dielectric substrate 2 that overlaps the placement surface 2a where the wafer W is placed in plan view. The first zone electrode 6a is made of a plurality of zone electrodes arranged in both the radial direction and the circumferential direction with respect to the center position of the dielectric substrate 2. Any number can be selected as the number of these zone electrodes. The first zone electrode has one zone electrode 61, four zone electrodes 62a, 62b, 62c, and 62d, and six zone electrodes 63a, 63b, 63c, 63d, 63e, and 63f. It is preferable that these zone electrodes do not overlap in plan view. Although it is preferable that the first zone electrode as a whole is circular or substantially circular, the present invention is not limited thereto.

The zone electrode 61 is circular in plan view and positioned at the center of the dielectric substrate 2.

Each of the four zone electrodes 62a to 62d is a strip-shaped electrode extending in the circumferential direction. The four zone electrodes 62a to 62d have the same shape and size. The four zone electrodes 62a to 62d are arranged at equal intervals in the circumferential direction radially outside the zone electrode 61. The four zone electrodes 62a to 62d are disposed in a circular ring shape in plan view.

Each of the six zone electrodes 63a to 63f is a strip-shaped electrode extending in the circumferential direction. The six zone electrodes 63a to 63f have the same shape and size. The six zone electrodes 63a to 63f are arranged at equal intervals in the circumferential direction radially outside the region where the four zone electrodes 62a to 62d are disposed. The six zone electrodes 63a to 63f are disposed in a circular ring shape in plan view.

The second zone electrode 6b is positioned in the peripheral edge portion of the dielectric substrate 2. The second zone electrode 6b is positioned in the region of the dielectric substrate 2 that overlaps the ring adsorption region 2d where the focus ring 5 is placed in plan view. The second zone electrode 6b is capable of adsorbing the focus ring 5. It is preferable that the second zone electrode 6b as a whole has a circular ring shape or a substantially circular ring shape. Any number can be selected as the number of zone electrodes included in the second zone electrode. In the case of the present embodiment, the second zone electrode 6b is made of four zone electrodes 64a, 64b, 64c, and 64d arranged in the planar direction of the dielectric substrate 2. Each of the four zone electrodes 64a to 64d has a strip shape extending along the peripheral edge portion of the dielectric substrate 2. The four zone electrodes 64a to 64d have the same shape and size. The four zone electrodes 64a to 64d are arranged at equal intervals in the peripheral edge portion of the dielectric substrate 2. The four zone electrodes 64a to 64d are disposed in a circular ring shape in plan view. It is preferable that these zone electrodes do not overlap in plan view.

In the electrostatic chuck device 1, the areas of the 11 electrodes configuring the first zone electrode 6a and the four electrodes configuring the second zone electrode 6b are values close to each other. In other words, it is preferable that the RF electrode 6 is divided into a plurality of electrodes having equal areas. As a result, the currents flowing through the plurality of divided zone electrodes become uniform. Current concentration in the power supply path from the main power supply rod 8 to the RF electrode 6 is unlikely to occur, and the power supply path is unlikely to be damaged. It is preferable that the plurality of electrodes are approximately equal in thickness as well. In addition, it is preferable that the first zone electrode 6a and the second zone electrode 6b do not overlap in plan view.

The division number of the RF electrode 6, that is, the area per zone electrode can be determined to be any in accordance with the magnitude of the electric power input to the RF electrode 6. In a case where high power such as 1 kW or more and 10 MHz or more is input as high-frequency power for plasma excitation, in the case of the electrostatic chuck device 1 for a 300 mm wafer, the RF electrode 6 is preferably divided into 10 to 20 zone electrodes. A more preferable division number of the RF electrode 6 is 13 to 17.

It should be noted that the mode of disposition of the plurality of zone electrodes configuring the first zone electrode 6a is an example, and another mode can also be adopted.

For example, although the first zone electrode 6a in the present embodiment is configured to be divided in both the radial direction and the circumferential direction, the first zone electrode 6a may be divided only in the radial direction or may be divided only in the circumferential direction.

In addition, although the second zone electrode 6b in the present embodiment is configured to be made of the plurality of zone electrodes 64a to 64d arranged in the circumferential direction, each of the zone electrodes 64a to 64d may be configured to be further divided in the radial direction. Alternatively, the second zone electrode 6b may have a configuration in which a plurality of circular ring-shaped zone electrodes are arranged in the radial direction. Each of the plurality of circular ring-shaped zone electrodes may have a continuous circular ring shape.

As illustrated in FIGS. 1 and 2, a plurality of power supply pins 7b extend toward the back surface 2b of the dielectric substrate 2 from the respective lower surfaces of the 11 electrodes configuring the first zone electrode 6a and the respective lower surfaces of the four electrodes configuring the second zone electrode 6b. The lower end portion of each power supply pin 7b protrudes downward from the back surface 2b. In the case of the present embodiment, one power supply pin 7b is connected to each of the 15 zone electrodes configuring the RF electrode 6. The power supply pin 7b is made of a metal material such as aluminum, copper, tungsten, and Kovar.

A short-circuit electrode 7a is made of a thin metal plate. The short-circuit electrode 7a is made of a metal material such as nickel, aluminum, and copper. As illustrated in FIG. 2, the short-circuit electrode 7a has a plurality of (eight) strip-shaped electrodes 71 to 78 extending radially outward from the center of the dielectric substrate 2. The strip-shaped electrodes 71 to 78 overlap one or more power supply pins 7b in plan view. Each of the strip-shaped electrodes 71 to 78 has a through hole into which the power supply pin 7b is inserted.

The short-circuit electrode 7a is fastened to the plurality of power supply pins 7b exposed on the back surface 2b of the dielectric substrate 2. In the case of the present embodiment, each power supply pin 7b is inserted into the through hole of the short-circuit electrode 7a. Each power supply pin 7b has a male screw portion in the lower end portion thereof. The short-circuit electrode 7a is fixed to the back surface of the dielectric substrate 2 by a nut 7c screwed onto the male screw portion of the power supply pin 7b. In addition, the plurality of nuts 7c electrically connect the short-circuit electrode 7a and the plurality of power supply pins 7b. With this configuration, the short-circuit electrode 7a is electrically connected to the first zone electrode 6a and the second zone electrode 6b.

A metal material similar to that of the power supply pin 7b can be used as the material configuring the nut 7c. The power supply pin 7b and the nut 7c may be made of different materials.

The main power supply rod 8 is fixed to the power supply pin 7b positioned at the center of the back surface 2b of the dielectric substrate 2. The main power supply rod 8 is a columnar conductive member in the case of the present embodiment. The main power supply rod 8 is made of a metal material such as aluminum, copper, and stainless steel. In the case of the present embodiment, the main power supply rod 8 has a configuration in which a Ni-plated thin film is provided on the surface of a base material made of a stainless steel rod material or pipe. The main power supply rod 8 has a female screw portion opening to the end surface on the dielectric substrate 2 side (upper end surface). The male screw portion in the lower end portion of the power supply pin 7b is screwed into the female screw portion of the main power supply rod 8.

The center portion of the short-circuit electrode 7a is fixed between the main power supply rod 8 and the dielectric substrate 2. The main power supply rod 8 is connected to the short-circuit electrode 7a on the end surface on the dielectric substrate 2 side. As a result, the main power supply rod 8 and the first zone electrode 6a and the second zone electrode 6b are electrically connected via the short-circuit electrode 7a and the power supply pin 7b.

As illustrated in FIG. 1, in the case of the present embodiment, the short-circuit electrode 7a is fixed to the plurality of power supply pins 7b in a bent state. In other words, the short-circuit electrode 7a, which is a thin metal plate, is held in a bent state between the positions of fastening to the dielectric substrate 2.

Although the dimensions of the short-circuit electrode 7a change as the temperature changes during use, in the present embodiment, the amount of bending of the short-circuit electrode 7a changes as the dimensions change, and thus the stress acting on the power supply pin 7b from the short-circuit electrode 7a can be reduced. In this way, a connecting portion between the short-circuit electrode 7a and the power supply pin 7b or a connecting portion between the power supply pin 7b and the zone electrode can be formed.

A power supply device 110 is connected to the main power supply rod 8. The power supply device 110 includes a high-frequency power supply 111 for plasma excitation, a matching box 112, a DC power supply 113 for electrostatic adsorption, and a resistor 114. The high-frequency power supply 111 for plasma excitation is electrically connected to the main power supply rod 8 via the matching box 112. The DC power supply 113 for electrostatic adsorption is electrically connected to the main power supply rod 8 via the resistor 114.

The focus ring 5 is disposed in the circular ring-shaped ring adsorption region 2d surrounding the placement surface 2a. Although there is a step between the placement surface 2a and the circular ring-shaped ring adsorption region 2d, a flat structure may be adopted without the step therebetween. In the dielectric substrate 2 of the present embodiment, a stepped surface facing radially outward is provided at the boundary between the placement surface 2a and the ring adsorption region 2d. In other words, the upper surface of the ring adsorption region 2d is positioned below the placement surface 2a. As illustrated in FIG. 1, the outer peripheral portion of the focus ring 5 disposed in the ring adsorption region 2d protrudes radially outward beyond the dielectric substrate 2. The outer peripheral portion of the focus ring 5 protruding outward from the dielectric substrate 2 is disposed in the notch portion 4b of the side cover 4. The height position of the upper surface of the focus ring 5 (position in the up-down direction) substantially matches the height position of the upper surface of the wafer W placed on the placement surface 2a.

The focus ring 5 is formed of, for example, a material equivalent in electrical conductivity to the wafer W placed on the placement surface 2a. Specifically, silicon, silicon carbide, quartz, alumina, or the like can be used as the constituent material of the focus ring 5. By disposing the focus ring 5, it is possible to make the plasma-related electrical environment substantially match the wafer W in the peripheral edge portion of the wafer W. As a result, no difference or unevenness in plasma treatment is likely to occur between the middle and peripheral edge portions of the wafer W.

The electrostatic chuck device 1 has a heater electrode 9 in the dielectric substrate 2 as illustrated in FIG. 1. The heater electrode 9 is positioned between the RF electrode 6 and the back surface 2b in the thickness direction of the dielectric substrate 2. The heater electrode 9 is electrically connected to a heater power supply 120. The plasma treatment apparatus 100 controls the electric power input from the heater power supply 120 to the heater electrode 9 to control the heating of the wafer W.

The heater electrode 9 may be divided into a plurality of heater zone electrodes arranged in the planar direction of the dielectric substrate 2. The shape and disposition of the heater zone electrodes are not particularly limited. In other words, the heater electrode 9 may be divided radially, circumferentially, or both radially and circumferentially. Although the heater electrode 9 is positioned in the dielectric substrate 2 in the present embodiment, the heater electrode 9 may be fixed outside the dielectric substrate 2.

The electrostatic chuck device 1 may include, in addition to the heater electrode 9, a temperature adjustment device coming into contact with the outer surface of the dielectric substrate 2. A liquid cooling base having a refrigerant flow path inside or the like can be disposed as the temperature adjustment device. The electrostatic chuck device 1 can also be configured without the heater electrode 9.

It is preferable that the RF electrode 6 and the heater electrode 9 are formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, and an yttrium oxide-molybdenum ($Y_2O_3$—Mo) conductive composite sintered body or a high-melting point metal such as tungsten (W), tantalum (Ta), and molybdenum (Mo).

Although the thicknesses of the RF electrode 6 and the heater electrode 9 are not particularly limited, the thicknesses can be, for example, 0.1 μm or more and 100 μm or less. More preferably, the thicknesses of the RF electrode 6 and the heater electrode 9 are 5 μm or more and 20 μm or less.

If the thicknesses of the RF electrode 6 and the heater electrode 9 are less than 0.1 μm, it is difficult to ensure sufficient conductivity. If the thicknesses of the RF electrode 6 and the heater electrode 9 exceed 100 μm, the difference in thermal expansion coefficient between the RF electrode 6 and the heater electrode 9 and the dielectric substrate 2 is likely to lead to cracking of the bonding interface between the RF electrode 6 and the dielectric substrate 2 and the bonding interface between the heater electrode 9 and the dielectric substrate 2.

As described above, in the electrostatic chuck device 1 of the present embodiment, the RF electrode 6 is divided into a plurality of zone electrodes and the RF electrode 6 and the main power supply rod 8 are electrically connected via the short-circuit member 7 interconnecting the plurality of zone electrodes. According to this configuration, the RF electrode 6 supplied with electric power from one main power supply rod 8 is divided into the plurality of zone electrodes 61, 62a to 62d, 63a to 63f, and 64a to 64d, and thus the current flowing through each zone electrode decreases. As a result, current concentration on the connecting portion between the short-circuit member 7 and the zone electrode is unlikely to occur, and damage to the connecting portion can be easily avoided.

In the present embodiment, the zone electrodes 62a to 62d are disposed in a circular ring shape around the zone electrode 61. In addition, the zone electrodes 63a to 63f are disposed in a circular ring shape around the zone electrodes 62a to 62d. Further, the zone electrodes 64a to 64d are disposed in a circular ring shape around the zone electrodes 63a to 63f. In other words, the RF electrode 6 is divided into a plurality of zone electrodes radially arranged with respect to the center position of the dielectric substrate 2 in plan view.

According to this configuration, the radial unevenness of the electric field strength in the RF electrode 6 can be reduced. The radial distribution of plasma excited on the dielectric substrate 2 can be made uniform.

In the present embodiment, the zone electrodes 62a to 62d, the zone electrodes 63a to 63f, and the zone electrodes 64a to 64d each are disposed at equal intervals in the circumferential direction in a circular ring-shaped region. In other words, the RF electrode 6 is divided into a plurality of zone electrodes arranged in the circumferential direction with respect to the center position of the dielectric substrate 2 in plan view.

According to this configuration, the circumferential unevenness of the electric field strength in the RF electrode 6 can be reduced. The circumferential distribution of plasma excited on the dielectric substrate 2 can be made uniform.

In the present embodiment, the short-circuit member 7 has the plurality of power supply pins 7b extending from each of the plurality of zone electrodes 61, 62a to 62d, 63a to 63f, and 64a to 64d to the back surface 2b side of the dielectric substrate 2 and exposed to the back surface 2b of the dielectric substrate 2 and the short-circuit electrode 7a positioned on the back surface 2b of the dielectric substrate 2, interconnecting the plurality of power supply pins 7b, and connected to the main power supply rod 8. According to this configuration, the short-circuit electrode 7a is outside the dielectric substrate 2 and is connected to the RF electrode 6 via the relatively long power supply pin 7b, and thus the stress attributable to a dimensional change of the short-circuit electrode 7a is unlikely to act on the connecting portion between the power supply pin 7b and the RF electrode 6 and damage can be more effectively suppressed even in a case where the short-circuit electrode 7a expands and contracts as a result of a change in temperature.

In addition, since the short-circuit electrode 7a is outside the dielectric substrate 2, the short-circuit electrode 7a is easily cooled. A rise in the temperature of the short-circuit member 7 as a whole can be suppressed, and thus the thermal stress acting on the connecting portion between the zone electrode and the power supply pin 7b can be reduced. The short-circuit electrode 7a can be directly air-cooled or liquid-cooled, and thus a mode of operation is also possible in which, for example, the short-circuit electrode 7a is cooled only during plasma excitation.

Although the electrostatic chuck device 1 with a configuration in which the RF electrode 6 also serves as an electrostatic adsorption electrode has been described in the present embodiment as one aspect of the wafer support device, the wafer support device of the present invention may be used in an electrostatic chuck function-less configuration.

Modification Example

Figure 3:
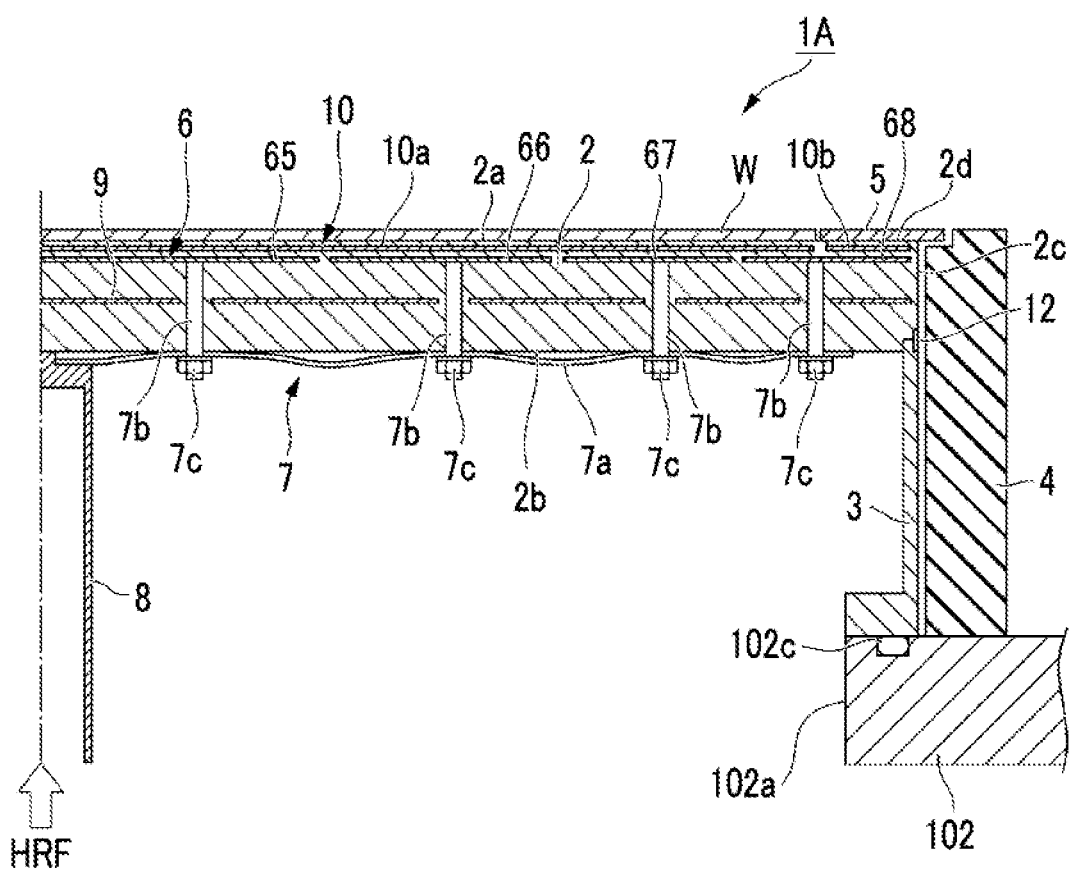
FIG. 3 is a schematic cross-sectional view illustrating a preferred example of an electrostatic chuck device of a modification example.

FIG. 3 is a partial cross-sectional view illustrating an electrostatic chuck device 1A of a modification example.

In FIG. 3, components denoted by the same reference numerals as in FIGS. 1 and 2 are components identical to those of the electrostatic chuck device 1 of the embodiment.

The electrostatic chuck device 1A of the modification example has an electrostatic adsorption electrode 10 in the dielectric substrate 2 and closer to the placement surface 2a side than the RF electrode 6. The electrostatic adsorption electrode 10 has a first electrostatic adsorption electrode 10a overlapping the placement surface 2a in plan view and a second electrostatic adsorption electrode 10b overlapping the ring adsorption region 2d in plan view. A common power supply or separate power supplies may be connected to the first electrostatic adsorption electrode 10a and the second electrostatic adsorption electrode 10b. The height positions of the first electrostatic adsorption electrode 10a and the second electrostatic adsorption electrode 10b (positions in the up-down direction) may or may not match each other.

Also in the electrostatic chuck device 1A of the modification example, the RF electrode 6 is divided into a plurality of zone electrodes. FIG. 3 schematically illustrates, for convenience, an example in which the RF electrode 6 is divided into four zone electrodes 65, 66, 67, and 68. Although it is preferable that these zone electrodes do not overlap in plan view, the present invention is not limited thereto and the zone electrodes may overlap at least in part. The short-circuit electrode 7a is connected to each of the four zone electrodes 65 to 68 via the power supply pin 7b. The short-circuit electrode 7a is connected to the main power supply rod 8 positioned in the middle portion of the back surface 2b of the dielectric substrate 2. Although it is preferable that the three zone electrodes 65 to 67 are positioned in the region overlapping the placement surface in plan view (first zone electrode), the present invention is not limited to this example. Although the zone electrodes 65 to 67 in FIG. 3 are disposed at the same height position in cross-sectional view, if necessary, the present invention is not limited to these examples.

In the case of the electrostatic chuck device 1A of the modification example, the zone electrode 68 (third zone electrode) positioned at the outermost periphery overlaps both the outer peripheral portion of the wafer W and the focus ring 5 in plan view. In the modification example illustrated in FIG. 3, there is no step between the placement surface 2a and the circular ring-shaped ring adsorption region 2d, the upper surface of the dielectric substrate 2 is a uniform flat surface, and the focus ring 5 and the wafer W have substantially the same thickness. By disposing the zone electrode 68 positioned in the outermost peripheral portion of the dielectric substrate 2 so as to straddle the boundary portion between the outer peripheral portion of the wafer W and the focus ring 5, uniform plasma excitation is easily performed above the outer peripheral portion of the wafer W and the focus ring 5. It should be noted that the step may be omitted if necessary. In other words, the upper surface of the dielectric substrate 2 may not be a uniform flat surface or there may be no step between the placement surface 2a and the circular ring-shaped ring adsorption region 2d.

In the case of the electrostatic chuck device 1A of the modification example, the dielectric substrate 2 and the support member 3 are separate members. The dielectric substrate 2 and the support member 3 are mutually fixed by a bonding material 12 extending in the circumferential direction along the outer peripheral surface. A brazing material, a ceramic thermal spray material, or the like can be used as the bonding material 12.

The support member 3 has a flange extending radially inward from an end portion, and the flange has an end portion overlapping the inside end portion of the bottom wall 102 in plan view.

The electrostatic chuck device 1A of the above modification example has the heater electrode 9 and the electrostatic adsorption electrode 10 in the dielectric substrate 2. The heater electrode 9 is positioned closer to the back surface 2b side of the dielectric substrate 2 than the RF electrode 6. The electrostatic adsorption electrode 10 is positioned closer to the wafer placement surface side of the dielectric substrate than the RF electrode 6. According to this configuration, the RF electrode 6 for plasma excitation and the electrostatic adsorption electrode 10 for electrostatic adsorption can be driven by separate power supplies.

The electrostatic chuck device 1A of the modification example can be used in place of the electrostatic chuck device 1 illustrated in FIG. 1. The configuration of the electrostatic chuck device can be selected in accordance with the configuration of the plasma treatment apparatus 100, the type of the wafer W to be placed, the mode of plasma to be excited, and so on.

INDUSTRIAL APPLICABILITY

According to the present invention, it is possible to provide a wafer support device highly reliable when used at a high temperature. According to the present invention, it is possible to provide an electrostatic chuck stage for high-temperature use to which high-power high-frequency waves can be applied.

REFERENCE SIGNS LIST

1: Electrostatic chuck device (wafer support device)
2: Dielectric substrate
2a: Placement surface
2b: Back surface
2c: Side end surface
2d: Ring adsorption region
3: Support member
3a: Flange
3b: Outer peripheral surface
4: Side cover
4a: Upper end portion
4b: Notch portion
4c: Upper end surface
5: Focus ring
5a: Upper surface of focus ring
6: RF electrode
6a: First zone electrode
6b: Second zone electrode
7: Short-circuit member
7a: Short-circuit electrode
7b: Power supply pin
7c: Nut
8: Main power supply rod
9: Heater electrode
10: Electrostatic adsorption electrode
10a: First electrostatic adsorption electrode
10b: Second electrostatic adsorption electrode
12: Bonding material
61, 62a to 62d, 63a to 63f, 64a to 64d, 65 to 68: Zone electrode
71 to 78: Strip-shaped electrode
100: Plasma treatment apparatus
101: Vacuum vessel
102: Bottom wall
102a: Opening portion
102b: Exhaust port
102c: Seal material
103: Side wall
104: Top wall
110: Power supply device
111: High-frequency power supply
112: Matching box
113: DC power supply
114: Resistor
120: Heater power supply
W: Wafer
HRF: High frequency (high-frequency power supply)

The invention claimed is:

1. A wafer support device comprising:
a dielectric substrate;
an RF electrode provided in the dielectric substrate, wherein the RF electrode is divided into a plurality of zone electrodes arranged in a planar direction of the dielectric substrate;
a short-circuit member which interconnects the plurality of zone electrodes; and
a main power supply rod which is connected to the short-circuit member from a back side of the dielectric substrate,
wherein the short-circuit member has a plurality of power supply pins which respectively extend from the plurality of zone electrodes to the back side of the dielectric substrate and exposed to a back surface of the dielectric substrate, and a short-circuit electrode which is positioned on the back surface of the dielectric substrate, interconnects the plurality of power supply pins with each other, and connected to the main power supply rod, and
wherein the short-circuit electrode is fixed to the plurality of power supply pins in a bent state.

2. The wafer support device according to claim 1, wherein the RF electrode is divided into a plurality of the zone electrodes which are arranged in a radial direction with respect to a center position of the dielectric substrate in plan view.

3. The wafer support device according to claim 1, wherein the RF electrode is divided into a plurality of the zone electrodes which are arranged in a circumferential direction with respect to a center position of the dielectric substrate in plan view.

4. The wafer support device according to claim 1, wherein the RF electrode is divided into a plurality of the zone electrodes which are equal in area.

5. The wafer support device according to claim 1, wherein a heater electrode and an electrostatic adsorption electrode are provided in the dielectric substrate,
the heater electrode is positioned closer to the back side of the dielectric substrate than the RF electrode, and
the electrostatic adsorption electrode is positioned closer to a wafer placement surface side of the dielectric substrate than the RF electrode.

6. The wafer support device according to claim 1, wherein the RF electrode includes a plurality of zone electrodes which perform plasma generation and electrostatic wafer adsorption.

7. The wafer support device according to claim 1, wherein the short-circuit electrode has a plurality of strip-shaped electrodes which extend radially outward from a center of the dielectric substrate.

8. The wafer support device according to claim 1, wherein the dielectric substrate has
a wafer placement surface, and
a circular ring-shaped region which surrounds the wafer placement surface and haves an upper surface positioned below the placement surface, and
the RF electrode has, in plan view,
a first zone electrode positioned in a region overlapping the wafer placement surface in plan view, and a second zone electrode positioned in a region overlapping the circular ring-shaped region in plan view.

9. The wafer support device according to claim 8, wherein the first zone electrode includes
a circular electrode which is positioned at a center, and
a plurality of strip-shaped electrodes which are arranged in circumferential and radial directions.

10. The wafer support device according to claim 8, wherein the second zone electrode includes a plurality of strip-shaped electrodes which are arranged in a circumferential direction.

11. The wafer support device according to claim 8, wherein the first zone electrode and the second zone electrode are located at different height positions.

12. The wafer support device according to claim 1, wherein the dielectric substrate has
a wafer placement surface,
a circular ring-shaped region which surrounds the wafer placement surface and has an upper surface at a same height as the placement surface,
a step located between the wafer placement surface and the circular ring-shaped region, and
the RF electrode has
a first zone electrode positioned in a region overlapping the wafer placement surface of the dielectric substrate in plan view, and
a third zone electrode positioned in a region overlapping both the wafer placement surface and the circular ring-shaped region in plan view.

13. The wafer support device according to claim 12, wherein the first zone electrode and the second zone electrode are located at a same height position.

* * * * *